US012575381B2

(12) United States Patent (10) Patent No.: US 12,575,381 B2
Elleuch et al. (45) Date of Patent: Mar. 10, 2026

(54) METHOD OF FORMING SILICON WITHIN A GAP ON A SURFACE OF A SUBSTRATE

(71) Applicant: ASM IP Holding B.V., Almere (NL)

(72) Inventors: Omar Elleuch, Litchfield Park, AZ (US); Robinson James, Phoenix, AZ (US); Peter Westrom, Payson, AZ (US); Caleb Miskin, Mesa, AZ (US); Alexandros Demos, Scottsdale, AZ (US)

(73) Assignee: ASM IP Holding B.V., Almere (NL)

( * ) Notice: Subject to any disclaimer, the term of this patent is extended or adjusted under 35 U.S.C. 154(b) by 454 days.

(21) Appl. No.: 18/212,827

(22) Filed: Jun. 22, 2023

(65) Prior Publication Data

US 2023/0420309 A1 Dec. 28, 2023

Related U.S. Application Data

(60) Provisional application No. 63/355,846, filed on Jun. 27, 2022.

(51) Int. Cl.
H01L 21/66 (2006.01)
H01L 21/02 (2006.01)
H01L 21/3065 (2006.01)

(52) U.S. Cl.
CPC ........ H01L 22/20 (2013.01); H01L 21/02532 (2013.01); H01L 21/3065 (2013.01)

(58) Field of Classification Search
None
See application file for complete search history.

(56) References Cited

U.S. PATENT DOCUMENTS

2023/0420309 A1* 12/2023 Elleuch ............ H01L 21/02636

* cited by examiner

*Primary Examiner* — Jack S Chen
(74) *Attorney, Agent, or Firm* — Snell & Wilmer L.L.P.

(57) ABSTRACT

A method of forming silicon within a gap on a surface of a substrate. The method includes use of two or more pyrometers to measure temperatures at two or more positions on a substrate and/or a substrate support and a plurality of heaters that can be divided into zones of heaters, wherein the heaters or zones of heaters can be independently controlled based on the measured temperatures and desired temperature profiles.

20 Claims, 10 Drawing Sheets

METHOD OF FORMING SILICON WITHIN A GAP ON A SURFACE OF A SUBSTRATE

CROSS-REFERENCE TO RELATED APPLICATIONS

This application is a nonprovisional of, and claims priority to and the benefit of, U.S. Provisional Patent Application No. 63/355,846, filed Jun. 27, 2022 and entitled "METHOD OF FORMING SILICON WITHIN A GAP ON A SUR-FACE OF A SUBSTRATE," which is hereby incorporated by reference herein.

FIELD OF INVENTION

The present disclosure generally relates to methods suitable for forming electronic devices. More particularly, the disclosure relates to methods that can be used for selectively forming a semiconductor material within a gap on a surface of a substrate.

BACKGROUND OF THE DISCLOSURE

The scaling of semiconductor devices, such as, for example, complementary metal-oxide-semiconductor (CMOS) devices, has led to significant improvements in speed and density of integrated circuits. However, conventional device scaling techniques face significant challenges for future technology nodes.

One particular challenge relates to the manufacture of devices that include epitaxial semiconductive material (e.g., silicon) within a gap on a surface of a substrate. Cyclical deposition and etch processes have been reported to selectively form semiconductor material on one surface (e.g., a bottom surface) relative to another surface (e.g., a sidewall surface) of a gap. However, temperature variation across a surface of a substrate during such processes may be undesirably high or unpredictable, which can lead to undesired variation in a thickness of epitaxial semiconductive material deposited using such techniques.

Accordingly, improved methods for uniformly and selectively forming semiconductor material within a gap on a surface of a substrate are desired.

Any discussion, including discussion of problems and solutions, set forth in this section has been included in this disclosure solely for the purpose of providing a context for the present disclosure. Such discussion should not be taken as an admission that any or all of the information was known at the time the invention was made or otherwise constitutes prior art.

SUMMARY OF THE DISCLOSURE

This summary is provided to introduce a selection of concepts in a simplified form. These concepts are described in further detail in the detailed description of example embodiments of the disclosure below. This summary is not necessarily intended to identify key features or essential features of the claimed subject matter, nor is it intended to be used to limit the scope of the claimed subject matter.

Various embodiments of the present disclosure relate to methods of forming (e.g., epitaxial) silicon within a gap on a surface of a substrate. While the ways in which various embodiments of the present disclosure address drawbacks of prior methods are discussed in more detail below, in general, various embodiments of the disclosure provide improved methods of controlling thickness (e.g., uniformly) of silicon deposited within the gap. As set forth in more detail below, exemplary methods described herein may be particularly useful in silicon isolation applications, where accurate control of silicon thickness is particularly important.

In accordance with exemplary embodiments of the disclosure, a method of forming silicon within a gap on a surface of a substrate includes providing the substrate within a reaction chamber of a reactor and selectively forming epitaxial silicon on a bottom surface of the gap relative to a sidewall of the gap—e.g., to fill the gap from the bottom upwards. The reactor includes a first zone of one or more heaters and a second zone of one or more heaters. The step of step of selectively forming epitaxial silicon includes measuring one or more first substrate temperatures at a first substrate location using a first pyrometer, measuring one or more second substrate temperatures at a second substrate location using a second pyrometer, independently controlling the first zone of one or more heaters (e.g., responsive to the step of measuring one or more first substrate temperatures), and independently controlling the second zone of one or more heaters (e.g., responsive to the step of measuring one or more second substrate temperatures). The first substrate location can be located at a center location of the substrate. The second substrate location can be radially exterior the first substrate location. The step of independently controlling the first zone of one or more heaters can include comparing a first substrate temperature of the one or more first substrate temperatures or an average or median or the like of the first substrate temperatures to a first substrate temperature setpoint. Similarly, the step of independently controlling the second zone of one or more heaters can include comparing a second substrate temperature of the one or more second substrate temperatures or an average or median or the like of the second substrate temperatures to a second substrate temperature setpoint. The first and second setpoints can be the same or different. In some cases, the method can additionally or alternatively include a step of determining a temperature difference between at least one of the one or more first substrate temperatures and at least one of the one or more second substrate temperatures, wherein one or more of the steps of independently controlling the first zone of one or more heaters and independently controlling the second zone of one or more heaters is responsive to the temperature difference. Additionally or alternatively the temperature difference can be compared to a temperature difference setpoint. The first and/or second zone of one or more heaters can each include one or more linear lamps and optionally one or more spot lamps. The first and/or second zone of one or more heaters can each include at least one heater above a substrate support or reaction chamber and at least one heater beneath the substrate support or reaction chamber. In some cases, it may be desirable to have a non-uniform temperature distribution across a surface of a substrate or a substrate support. In such cases, the method can further include determining a desired temperature profile within a first and/or second region on the substrate, wherein a first power offset can be based on the desired temperature profile within the first region on the substrate and a second power offset can be based on the desired temperature profile within the second region on the substrate. Additionally or alternatively a power offset can be based on a heat output/power input of one or more heaters. In accordance with various examples, the step of selectively forming epitaxial silicon on a bottom surface can include depositing silicon within the gap and etching silicon to remove silicon from the sidewall. In some cases, the steps of depositing silicon and etching can be repeated to fill the gap and/or to deposit a desired amount of material.

These and other embodiments will become readily apparent to those skilled in the art from the following detailed description of certain embodiments having reference to the attached figures. The invention is not being limited to any particular embodiments disclosed.

BRIEF DESCRIPTION OF THE DRAWING FIGURES

A more complete understanding of the embodiments of the present disclosure may be derived by referring to the detailed description and claims when considered in connection with the following illustrative figures.

Figure 1:
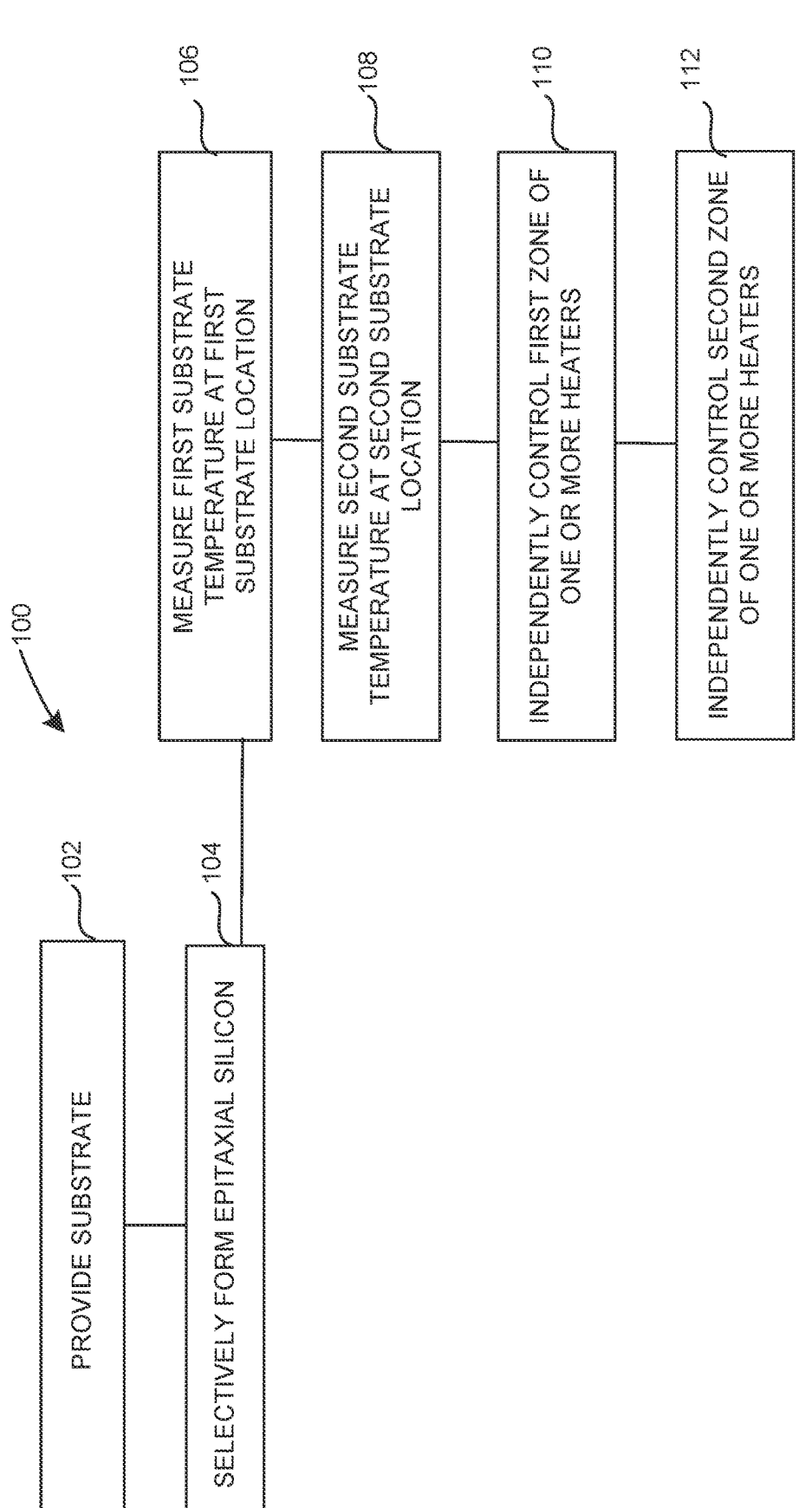
FIG. 1 illustrates a method in accordance with at least one embodiment of the disclosure.

It will be appreciated that elements in the figures are illustrated for simplicity and clarity and have not necessarily been drawn to scale. For example, the dimensions of some of the elements in the figures may be exaggerated relative to other elements to help improve the understanding of illustrated embodiments of the present disclosure.

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below. Further, the illustrations presented herein are not necessarily meant to be actual views of any particular apparatus, structure, or the like, but rather may be idealized representations that can be used to describe embodiments of the disclosure.

As set forth in more detail below, various embodiments of the disclosure provide methods of forming silicon within a gap on a surface of a substrate. Exemplary methods can be used to, for example, forming silicon isolation structures. The silicon isolation structures may be used in the formation of devices, such as nanosheet or gate-all-around semiconductor devices.

As used herein, the term "substrate" can refer to any underlying material or materials that can be used to form, or upon which, a device, a circuit, or a film can be formed. A substrate can include a bulk material, such as silicon (e.g., single-crystal silicon), other Group IV materials, such as carbon, germanium, and/or tin, or compound semiconductor material, and can include one or more layers overlying or underlying the bulk material. Further, the substrate can include various features, such as gaps, protrusions, and the like formed within or on at least a portion of a layer of the substrate.

As used herein, the term "epitaxial layer" can refer to a substantially single crystalline layer upon an underlying substantially single crystalline substrate or layer.

As used herein, the term "monocrystalline" may refer to a material that includes a substantial single crystal, i.e., a crystalline material that displays long range ordering. It should, however, be appreciated that a "monocrystalline" material may not be a perfect single crystal but may comprise various defects, stacking faults, atomic substitutions, and the like, as long as the "monocrystalline" material exhibits long range ordering. Epitaxial material may be monocrystalline material.

As used herein, the term "chemical vapor deposition" can refer to any process wherein a substrate is exposed to one or more volatile precursors, which react and/or decompose on a substrate surface to produce a desired deposition.

As used herein, the term "film" and/or "layer" can refer to any continuous or non-continuous structures and material, such as material deposited by the methods disclosed herein. For example, film and/or layer can include two-dimensional materials, three-dimensional materials, nanoparticles or even partial or full molecular layers or partial or full atomic layers or clusters of atoms and/or molecules. A film or layer may comprise material or a layer with pinholes, which may be at least partially continuous.

As used herein, a "structure" can include a substrate as described herein. Structures can include one or more layers overlying the substrate, such as one or more layers formed according to a method as described herein.

Further, in this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or other derived representative value. Further, in this disclosure, the terms "include," "including," "constituted by" and "having" can refer independently to "typically or broadly comprising," "comprising," "consisting essentially of," or "consisting of" in some embodiments. In this disclosure, any defined meanings do not necessarily exclude ordinary and customary meanings in some embodiments.

Turning now to the figures, FIG. 1 illustrates a method 100 of forming silicon within a gap on a surface of a substrate in accordance with various examples of the disclosure. Method 100 includes the steps of providing the substrate within a reaction chamber of a reactor (step 102) and selectively forming epitaxial silicon on a bottom surface of the gap relative to a sidewall of the gap (step 104).

Figure 2:
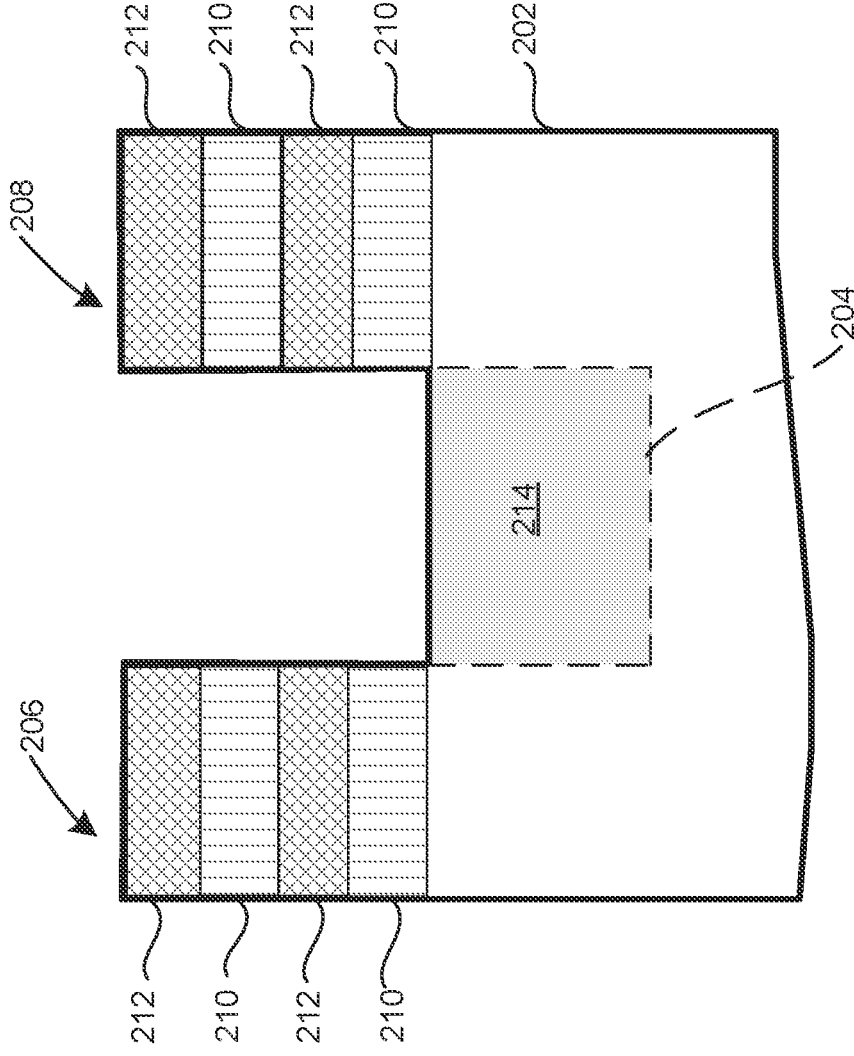
FIG. 2 illustrates a substrate and a structure in accordance with exemplary embodiments of the disclosure.

Step 102 can include providing a substrate, comprising a surface comprising a gap. With reference to FIG. 2, substrate 200 can include bulk material 202 and a gap 204 (shown with a dashed line) formed therein. In the illustrated example, substrate 200 further includes laminate structures 206, 208, which include alternating layers of silicon germanium 210 and silicon 212. Gap 204 can be disposed within bulk material 202 and between laminate structures 206, 208.

As a non-limiting example, a reactor suitable for step 102 can include a reaction chamber of a chemical vapor deposition system. The reaction chamber can be a stand-alone reaction chamber or part of a cluster tool.

Figure 9:
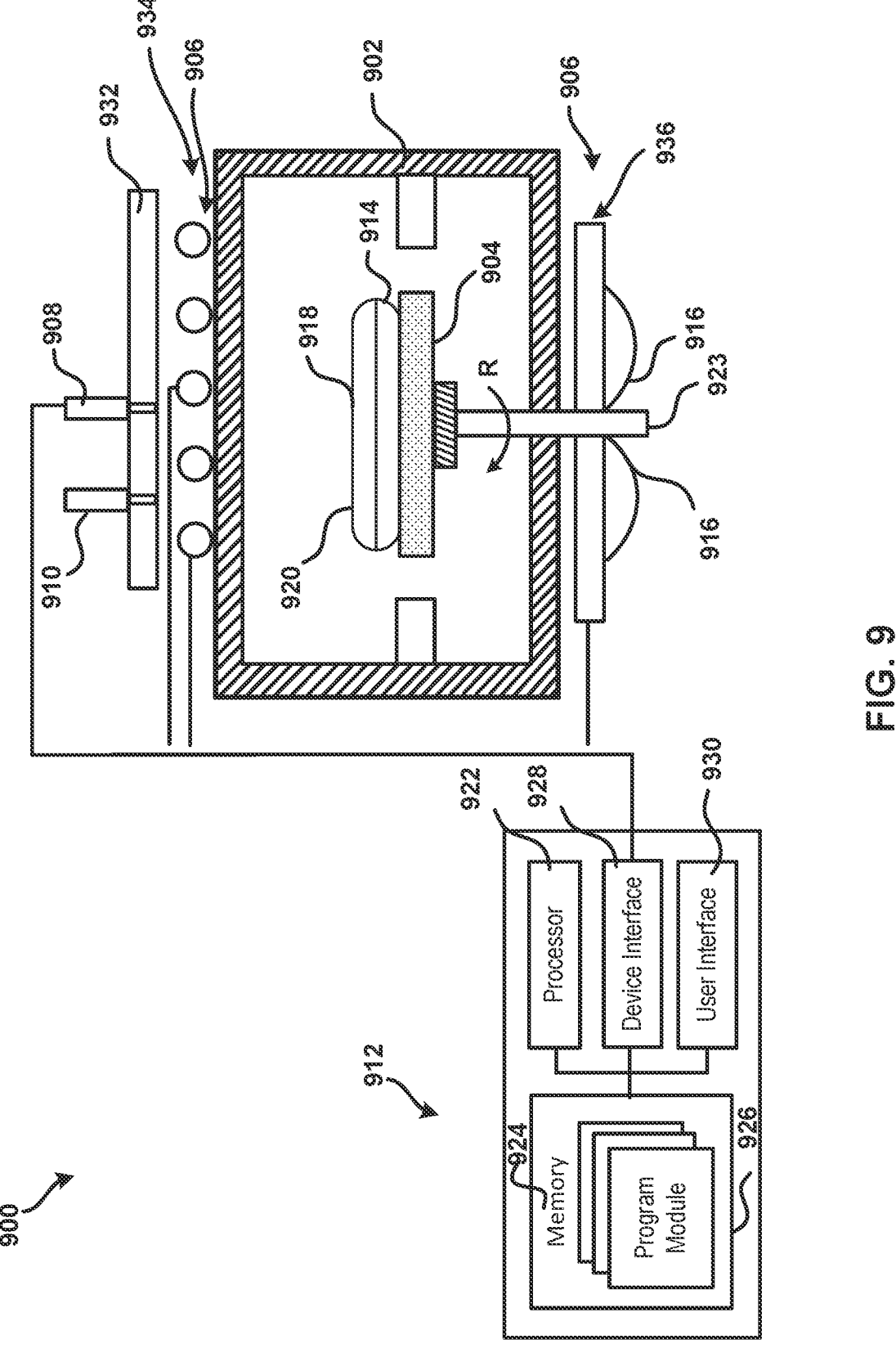
FIG. 9 illustrates a reactor system in accordance with additional exemplary embodiments of the disclosure.

FIG. 9 illustrates an exemplary reactor 900 suitable for use during method 100. Reactor 900 includes a reaction chamber 902, a substrate support or susceptor 904, an array of heaters 906, a first pyrometer 908, a second pyrometer 910, and a controller 912. Reactor 900 can also include a reflector or reflective surface 932, wherein at least a portion 934 of array of heaters 906 is between reflector 932 and reaction chamber 902.

Reaction chamber(s) 902 can be formed of any suitable material, such as ceramic materials including quartz and sapphire, or any other material transparent to radiation used to measure a temperature within the reaction chamber. By way of particular example, reaction chamber(s) 902 can be formed of quartz, which transmits electromagnetic radiation emitted by substrate supported on the substrate support 904 to the pyrometers 908, 910, and from which the pyrometers 908, 910 determine temperature at locations on the substrate corresponding to the spacing of the pyrometers 908, 910.

Substrate support 904 can be formed of for example, graphite, and may have silicon carbide coating. Is some cases, substrate support 904 is formed of material that emits radiation used by pyrometers 908, 910 to measure a temperature of substrate support 904. As illustrated, substrate support 904 can be connected to a rotatable shaft 923 that is configured to cause substrate support 904 to rotate.

As described in more detail below, pyrometers 908, 910 can be used to measure temperatures at different locations on a substrate 914 (or a corresponding location on a substrate support), and the temperature measurements at the different substrate locations or substrate support locations) can be used to independently control two or more (e.g., a first and second) zones of heaters to obtain a desired temperature profile across substrate 914 during step 102 and/or step 104. As used herein, "substrate location" can refer to a substrate support location that is or would be underneath such substrate location. For example, a center location of the substrate may overlay the rotatable shaft 923.

Array of heaters 906 can include any suitable heaters. By way of examples, array of heaters can be or include, for example, one or more (e.g., infrared) heating lamps. As discussed in more detail below, array of heaters 906 can include one or more heaters aligned in a first direction and one or more heaters aligned in a second (e.g., substantially perpendicular— e.g., 85-95 degrees offset from the first direction) direction. For example, array of heaters 906 can include a first portion 934 of heaters aligned in a first direction and a second portion 936 of heaters aligned in a second direction. The heaters can be or include linear lamps. In addition, array of heaters 906 can include one or more (e.g., infrared) spot lamps 916.

Figure 10:
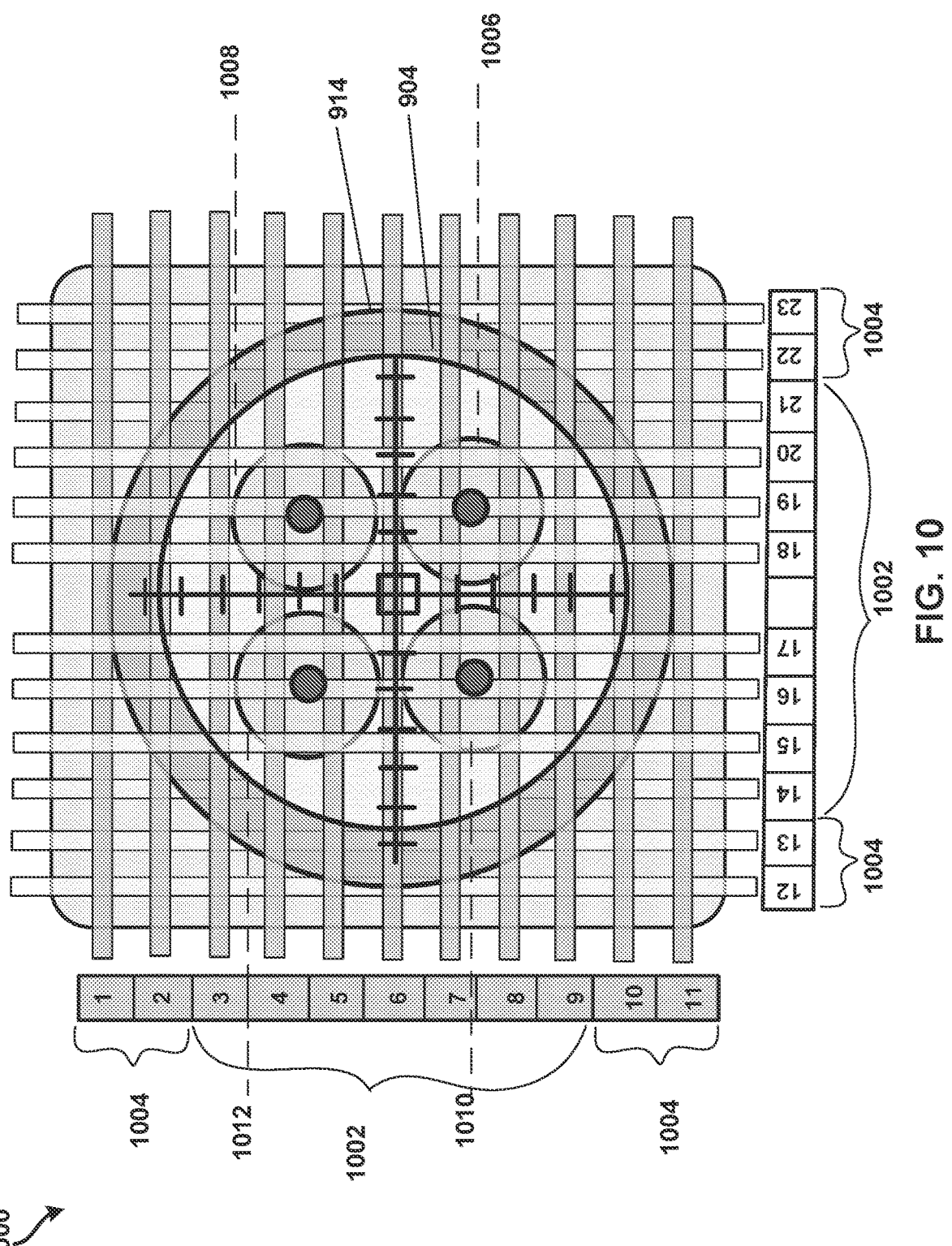
FIG. 10 illustrates first and second zones of one or more heaters in accordance with examples of the disclosure.

FIG. 10 illustrates an exemplary array of heaters 1000 suitable for use as array 906 in accordance with examples of the disclosure. Array of heaters 1000 includes a first zone of one or more heaters 1002 and a second zone of one or more heaters 1004. Exemplary arrays of heaters can suitably include more than two zones of heaters. For example, exemplary arrays of heaters can include 3, 4, 5, 7, or more zones. Further, although illustrated with a particular number of heaters in first zone of heaters 1002 and second zone of heaters 1004, any suitable number of heaters can be used in respective zones in accordance with method 100.

By way of examples, first zone of heaters 1002 can include a one or more linear lamps above substrate support 904 or reaction chamber 902 and/or below substrate support 904 or reaction chamber 902. The linear lamps can be, for example, silicon-controlled rectifier (SCR) linear lamps. Each linear lamp can exhibit, for example, about 10,000 W maximum output. Additionally or alternatively, second zone of heaters 1004 can include one or more linear lamps above substrate support 904 or reaction chamber 902 and/or below substrate support 904 or reaction chamber 902. In addition, one or more of the first zone of heaters 1002 or the second zone of heaters 1004 can include one or more spot lamps 916 above and/or below substrate support 904 or reaction chamber 902. The spot lamps can each be formed of, for example, four individual round spots and can be located, for example, below substrate support 904 and reaction chamber 902. The maximum capacity of each (e.g., round) spot lamp can be about 1000-2000 W.

In the illustrated example shown in FIG. 10, array of heaters 1000 includes linear heaters 1-11 above substrate support or reaction chamber 902, and linear heaters 12-23 and spot lamps 1006-1012 below substrate support 904 (e.g., corresponding to spot lamps 916) or reaction chamber 902. Various configurations and numbers of heaters are contemplated. For example, first zone of one or more heaters 1002 can include 2 to 12 or 2 to 8 or 2 to 4 (e.g., linear) first zone heaters above and/or below substrate support 904 or reaction chamber 902 (for a total of 2 to 24 or 2 to 16 or 2 to 8 linear heaters). Additionally or alternatively, second zone of one or more heaters 1004 can include 2 to 12 or 2 to 8 or 2 to 4 (e.g., linear) second zone heaters heaters—above or below substrate support 904 and/or reaction chamber 902 (for a total of 2 to 24 or 2 to 16 or 2 to 8 heaters). Further, one or more of the first zone of heaters 1002 and second zone of heaters 1004 can optionally 1 to 10 or 2 to 6 or about 4 spot lamps above and/or below substrate support 904 or reaction chamber 902. The specific example illustrated in FIG. 10 include first zone of one or more heaters 1002 including 7 first zone heaters (heaters 3-9) above reaction chamber 902, 8 first zone heaters (heaters 14-21) below reaction chamber 902 and four first zone spot lamps 1006-1012 below reaction chamber 902. Second zone of one or more heaters 1004 includes four (e.g., linear) second zone heaters (heaters 1, 2, 10, and 11) above reaction chamber 902 and four (e.g., linear) second zone heaters (heaters 12, 13, 22, and 23) below reaction chamber 902.

In accordance with examples of the disclosure, heaters (e.g., heaters 3-9 and 14-21) of first zone of heaters 1002 are located inward of heaters (e.g., heaters 1, 2, 10,-31 13, 22, and 23) of second zone of heaters 1004. Other configurations are also contemplated. For example heaters of second zone of heaters 1004 can be located inward of heaters of first zone of heaters 1002. Alternatively, heaters of first zone of heaters 1002 and heaters of first zone of heaters 1002 can alternate or be grouped in other configurations.

Referring again to FIG. 9, controller 912 can be configured to provide independent control to one or more of the zones of heaters (e.g., zones of heaters 1002 and 1004) and/or one or more heaters within each zone of heaters (e.g., heaters 1-23). For example, controller 912 can be configured to independently provide proportional-integral-derivative (PID) control to the one or more heaters or a plurality of heaters within each zone of heaters based on input received from two or more pyrometers, such as pyrometers 908 and 910. As discussed in more detail below, a power offset can be used to provide different power levels to various heaters within a zone of heaters to obtain a desired temperature profile and/or to account for varying efficiencies of one or more heaters within the zone of heaters.

By way of example, controller 912 can be configured to generate signals (e.g., proportional power outputs) for independently controlling first zone of heaters 1002 based on sensed temperatures at a first substrate or susceptor location 918 and for independently controlling second zone of heaters 1004 based on sensed temperatures at a second substrate or susceptor location 920. To this end, the temperature information or pyrometer temperature outputs, are communicated to controller 912 for processing and, in response, controller 912 generates corresponding control outputs to heaters 1-23 or to zones of heaters 1002 and 1004. Exemplary methods of generating the control signals are described below.

In the illustrated example, controller 912 includes a processor 922 that manages memory 924 of the controller 912 (or accessible by controller 912), and program module 926 that can include software or executable instructions or code that may be executed by processor 922 to provide temperature monitoring and control functions described herein.

Controller 912 can further include a user interface 930 for facilitating an operator selecting between control or program modules 926, interacting with monitored temperature data, modifying or updating deposition or processing parameters, and the like. User interface 930 can include a graphical user interface (GUI) generated by the processor 922 that may be displayed on a monitor, touchscreen, or the like. The GUI can be used to, for example, input setpoints as described herein. A device interface 928 may be provided as part of controller 912 with one or more input/output (I/O) components to facilitate wired or wireless communications between controller 912, pyrometers 908, 910 and/or one or more heaters 1-23 or one or more zone of heaters 1002, 1004.

Returning again to FIG. 1, during step 102, a temperature within the reaction chamber (e.g., of a susceptor and/or reaction chamber wall) can be about 200° C. to about 900° C., about 200° C. to about 700° C., about 500° C. to about 900° C., or about 500° C. to about 650° C. A pressure within the reaction chamber can be about 10 Torr to about 80 Torr, about 10 Torr to about 200 Torr, or about 5 Torr to about 600 Torr.

In some cases, method 100 can include a bake step prior to step 104. In these cases, a temperature within the reaction chamber can be about 600° C. to about 1200° C., about 650° C. to about 1000° C., or about 700° C. to about 900° C. during the bake step. A pressure within the reaction chamber during the bake step can be about 2 Torr to about 1 ATM, about 2 Torr to about 400 Torr, or 2 Torr to about 200 Torr. After step 102 and any bake step, the reaction chamber (e.g., a susceptor within the reaction chamber) can be brought to a desired deposition temperature.

During step 104, epitaxial silicon is selectively formed on a bottom surface of the gap relative to a sidewall of the gap. Suitable silicon precursors for depositing epitaxial silicon include halides, such as silicon halides. In some embodiments, the silicon halide compound can include, for example, a silicon halide having the general formula given as: $Si_xW_yH_z$, wherein "W" is a halide selected from the group consisting of Fluorine (F), Chlorine (CI), Bromine (Br), and Iodine (I), "x" and "y" are integers greater than zero, and "z" is an integer greater than or equal to zero. In some embodiments, the silicon halide precursor may be selected from the group consisting of silicon fluorides (e.g., $SiF_4$), silicon chlorides (e.g., $SiCl_4$), silicon bromides (e.g., $SiBr_4$), and silicon iodides (e.g., $SiI_4$). In some embodiments, the silicon halide precursor may comprise silicon tetrachloride ($SiCl_4$).

In some embodiments, precursor may comprise a silane, such as, for example, silane ($SiH_4$), disilane ($Si_2H_6$), trisilane ($Si_3H_8$), tetrasilane ($Si_4H_{10}$) or higher order silanes with the general empirical formula $Si_xH_{(2x+2)}$.

By way of examples, the precursor can be or include one or more of silicon tetrachloride ($SiCl_4$), trichloro-silane ($SiCl_3H$), dichlorosilane ($SiCl_2H_2$), monochlorosilane (Si-$ClH_3$), hexachlorodisilane (HCDS), octachlorotrisilane (OCTS), or an amino-based precursor, such as hexakis (ethylamino)disilane (AHEAD) or $SiH[N(CH_3)_2]_3$ (3DMASi), a bis(dialkylamino)silane, such as BDEAS (bis (diethylamino)silane), a mono(alkylamino)silane, such as di-isopropylaminosilane, or an oxysilane based precursor, such as tetraethoxysilane $Si(OC_2H_5)_4$. In some cases, the precursor preferentially includes a halogen.

In some cases, a dilution gas, such as hydrogen, or an inert gas can be provided to the reaction chamber during step 104. Additionally or alternatively, a carrier gas, such as an inert gas, can be provided to the reaction chamber during step 104.

In accordance with further examples of the disclosure, an etchant can be provided to the reaction chamber during step 104. The etchant can be provided from the same source vessel as the precursor or separately provided to the reaction chamber. In some cases, the etchant can be co-flowed to the reaction chamber with the silicon precursor. In some cases, step 104 can include depositing silicon within the gap and (e.g., selectively) etching silicon to remove silicon from the sidewall. In such cases, one or more of the first substrate temperature setpoint and the second substrate temperature setpoint can differ for the step of depositing and the step of etching. For example, the first substrate temperature setpoint for the step of depositing and the first substrate temperature setpoint for the step of etching can differ by about 50 or about 100° C. Additionally or alternatively, the second substrate temperature setpoint for the step of depositing and the second substrate temperature setpoint for the step of etching can differ by about 50 or about 100° C. Such differing setpoints can facilitate obtaining desired uniformity of selectively formed epitaxial silicon within gaps across a surface of the substrate. In accordance with further examples, the steps of depositing and etching to fill the gap with silicon can be repeated one or more times to fill a gap to a desired level (e.g., about flush with a surface of bulk material 202).

Exemplary etchants include halides, such as compounds comprising one or more of fluorine (F), chlorine (CI), bromine (Br), and iodine (I). By way of examples, the etchant can be or include hydrogen chloride and/or one or more halogen gases, such as $F_2$, $Cl_2$, $Br_2$, and $I_2$. Use of the etchant can facilitate selective deposition of the epitaxial silicon on a bottom surface of the gap relative to a sidewall of the gap.

During step 104, it is desirable to maintain accurate temperature control of one or more zones of heaters described above. To maintain the desired temperature control, method 100 includes, during step 104, measuring one or more first substrate temperatures at a first substrate location 918 using a first pyrometer (e.g., pyrometer 908) (step 106); measuring one or more second substrate temperatures at a second substrate location 920 using a second pyrometer (e.g., pyrometer 910) (step 108); responsive to the step of measuring one or more first substrate temperatures, independently controlling the first zone of one or more heaters (step 110) (e.g., using controller 912); and responsive to the step of measuring one or more second substrate temperatures, independently controlling the second zone of one or more heaters (step 112) (e.g., using controller 912).

In accordance with examples of the disclosure, first substrate location 918 is at a center location of the substrate or at a center of a substrate support. In this context, a center location can be a center or up to 2 cm or up to 5 cm from a center of the substrate. Second substrate location 920 can be (e.g., radially) exterior first substrate location 918. For example, second substrate location 920 can be at a (e.g., radial) distance of about 5 to about 10 or about to about 10 cm from first substrate location 918. For example, the second substrate location 920 may be radially offset from the rotatable shaft 923.

Step 106 of measuring one or more first substrate temperatures at a first substrate location can include measuring a plurality of first location temperatures at the first substrate location to obtain a plurality of first location temperature measurements. Similarly, step 108 of measuring one or more second substrate temperatures can include measuring a plurality of second location temperatures at the second substrate location to obtain a plurality of second location temperature measurements. Each measured temperature at each location and/or a value derived from the plurality measured temperatures can be compared to a setpoint. Additionally or alternatively, a difference between the measured temperatures at the first and second locations or derivative values (e.g., mean, median, or the like) thereof can be compared to a temperature difference setpoint.

Steps 110 and 112 of independently controlling the first zone of one or more heaters and controlling the second zone of one or more heaters can be performed using a variety of techniques. For example, step 110 of independently controlling the first zone of one or more heaters can include comparing a first substrate temperature of the one or more first substrate temperatures to a first substrate temperature setpoint to generate a control signal for the first zone of heaters using controller 912. Similarly, step 112 of independently controlling the second zone of one or more heaters can include comparing the second substrate temperature of the one or more second substrate temperatures to a second substrate temperature setpoint to generate a control signal for the second zone of heaters using controller 912.

When step 106 includes measuring a plurality of first location temperatures at the first substrate location, the plurality of first location temperatures at the first substrate location can be used to obtain a plurality of first location temperature measurements. In this case, the step of independently controlling the first zone of one or more heaters can include comparing a value derived (e.g., a mean, median, or like value) from the plurality of first location temperature measurements to a first substrate temperature setpoint to generate a control signal for the first zone of heaters. Similarly, when step 108 includes measuring a plurality of second location temperatures at the second substrate location, the plurality of second location temperatures at the second substrate location can be used to obtain a plurality of second location temperature measurements. In this case, the step of independently controlling the second zone of one or more heaters can include comparing a value derived (e.g., a mean, median, or like value) from the plurality of second location temperature measurements to a second substrate temperature setpoint to generate a control signal for the second zone of heaters.

As noted above, in some cases, the step of controlling can be based on a temperature offset between a desired temperature at a first substrate location and a desired temperature at a second substrate location. Such temperature offset can range from, for example 0° C. to about 5° C. or 0 to about 2° C. or about 1° C. to about 2° C. In some cases, method 100 can include determining a temperature difference between at least one of the one or more first substrate temperatures and at least one of the one or more second substrate temperatures, wherein one or more of the steps of independently controlling the first zone of one or more heaters and independently controlling the second zone of one or more heaters is responsive to the temperature difference. For example, the measured temperature difference can be compared to a temperature difference setpoint. In some cases, one or more of the steps of independently controlling the first zone of one or more heaters and independently controlling the second zone of one or more heaters is responsive to the temperature difference and one or more of the value derived from the plurality of first location temperature measurements or the value derived from the plurality of second location temperature measurements.

In accordance with further examples of the disclosure, method 100 can further include determining a power offset between two or more heaters of a zone of one or more heaters. The power offset can be based on, for example, a desired temperature profile and/or heat outputs/power inputs of the respective heaters. For example, when the first zone of one or more heaters comprises two or more first zone heaters, method 100 can further include determining a first power offset for two or more of the first zone heaters, wherein the step of independently controlling the first zone of one or more heaters comprises providing power to the two or more first zone heaters responsive to the first power offset for each of the respective heaters. Similarly, when the second zone of one or more heaters includes two or more second zone heaters, method 100 can further include determining a second power offset for two or more of the second zone heaters, wherein the step of independently controlling the second zone of one or more heaters comprises providing power to the two or more second zone heaters responsive to the second power offset for each of the respective heaters.

In accordance with yet further examples of the disclosure, method 100 can further include a step of determining a desired temperature profile within a first region (e.g., at or near location 918) on the substrate, and the first power offset can be based on the desired temperature profile within the first region on the substrate. Additionally or alternatively, method 100 can include a step of determining a desired temperature profile within a second region (e.g., at or near location 920 or along about a same radius) on the substrate, and the second power offset can be based on the desired temperature profile within the second region on the substrate.

With reference again to FIG. 2, selectively formed epitaxial silicon 214 may desirably fill gap 204 and may desirably be substantially coplanar (e.g., within about 10 nm) of a top surface of gap 204 or a top surface of bulk material 202. Such filling generally demands tight process control of depositing and/or etch processes, which can be obtained using the temperature measurement and control steps described herein, whereas convention processing can lead to undesired variation, such as underfill and/or overfill of gap 204 both within a substrate and from substrate to substrate. For example, if epitaxial silicon 214 overfills gap 204, etching of silicon germanium layer 210 can be blocked and/or silicon layers 212 can be shorted.

Methods described herein exhibit tighter within substrate temperature control and substrate-to-substrate temperature control. Therefore, better control over an amount of epitaxial silicon within a gap can be achieved. By way of examples, compared to methods in which thermocouples are used to measure temperature, rather than pyrometers, a maximum temperature overshoot can be reduced (e.g., from about 21° C. to about 12° C. or less than 12° C.). A maximum undershoot can also be reduced (e.g., from about 40° C. to less than 10° C.). Further, a time to stabilize a temperature of a substrate support (e.g., substrate support 904) can be reduced (e.g., from about 400 seconds to less than 100 seconds). Non-uniformity of a thickness of epitaxial silicon can be reduced from about 1.5% to 0.16% or less.

Figure 3:
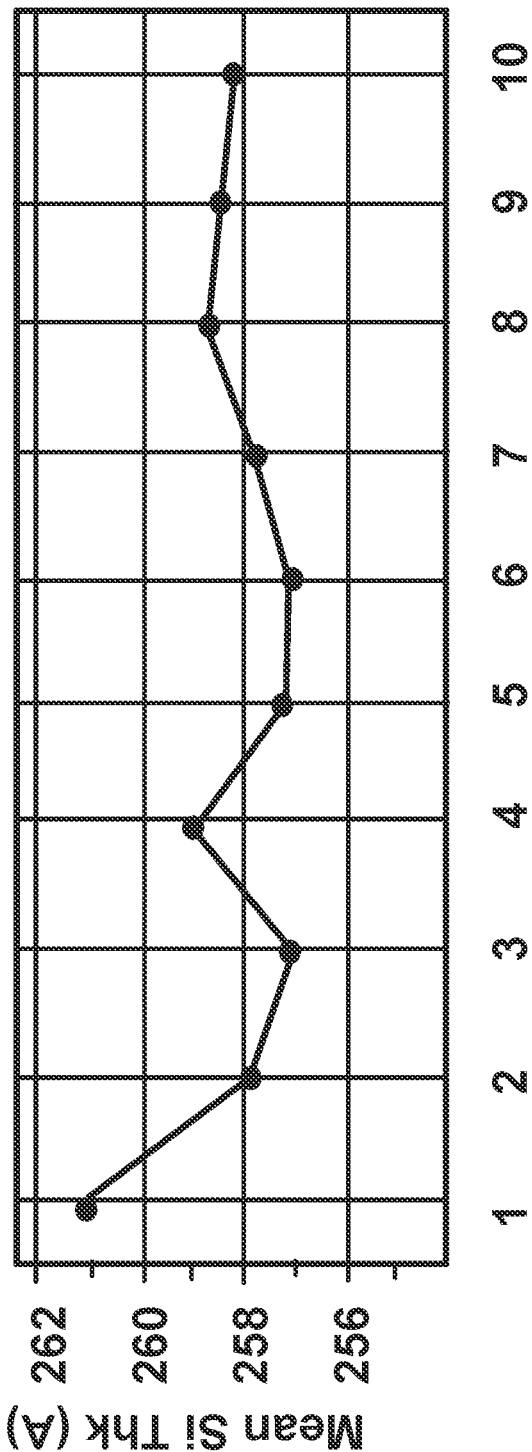
FIG. 3 illustrates wafer-to-wafer non-uniformity of silicon deposited using thermocouple temperature measurements.
Figure 4:
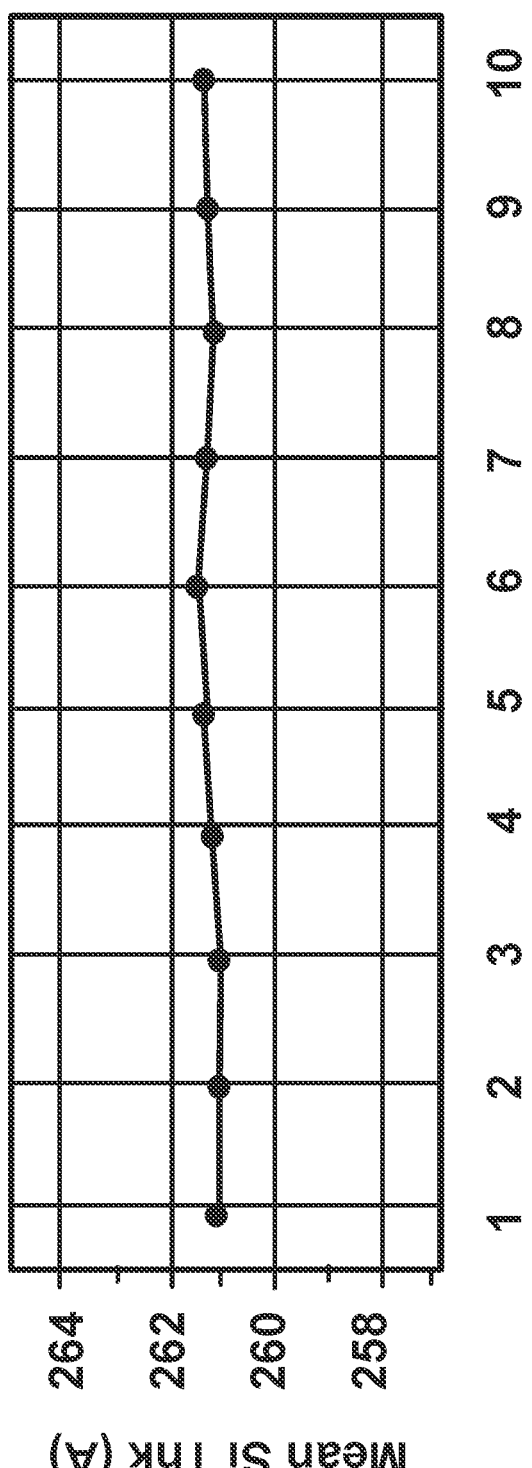
FIG. 4 illustrates substrate-to-substrate non-uniformity of silicon deposited using a method in accordance with embodiments of the disclosure.

FIG. 3 illustrates substrate to substrate mean epitaxial silicon thickness as measured on 10 substrates processed using thermocouples to measure substrate support temperatures. The non-uniformity percent is 1.47%. FIG. 4 illustrates substrate to substrate mean epitaxial silicon thickness as measured on 10 substrates processed using a method (e.g., method 100) as described herein. The reactor and conditions were otherwise the same as the reactor and conditions used to generate date for FIG. 3. The non-uniformity percent is reduced to 0.16% using a method described herein.

Figure 5:
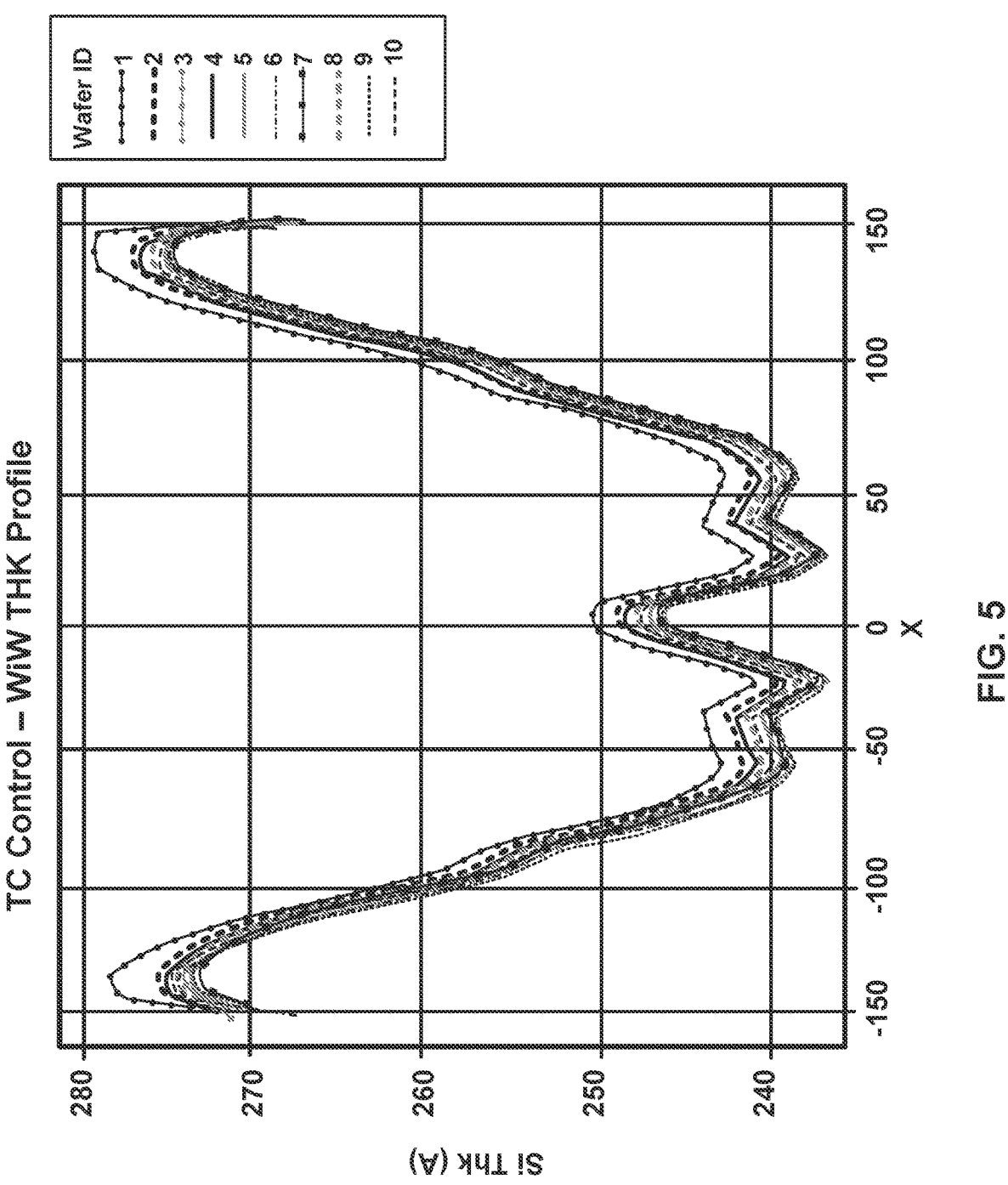
FIG. 5 illustrates substrate-to-substrate non-uniformity of silicon deposited at a plurality of locations using thermocouple temperature measurements.
Figure 6:
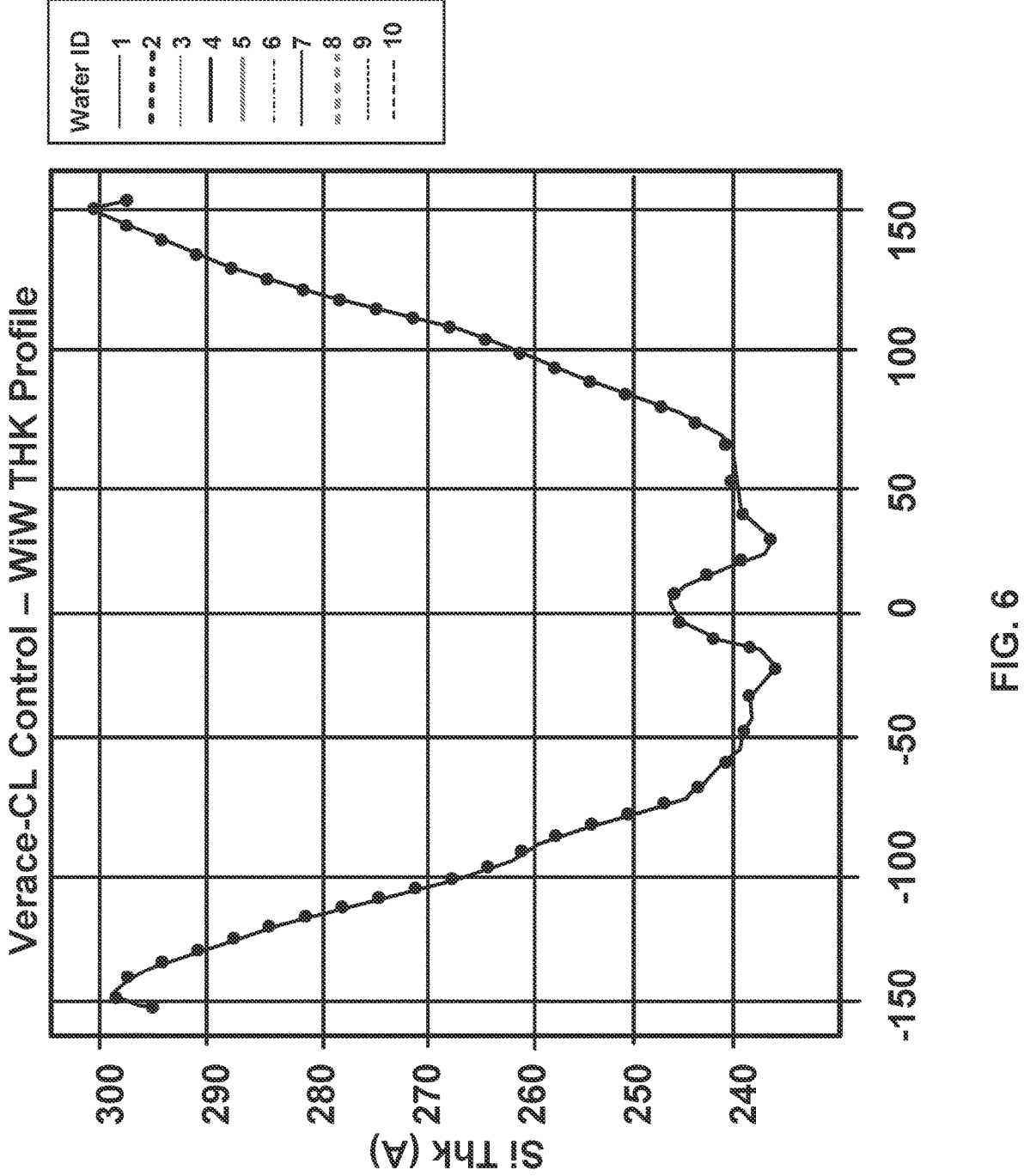
FIG. 6 illustrates substrate-to-substrate non-uniformity of silicon deposited at a plurality of locations using a method in accordance with embodiments of the disclosure.

FIG. 5 illustrates within-substrate epitaxial silicon thickness measurements for epitaxial silicon deposited on substrates using thermocouple temperature measurements and FIG. 6 illustrates within-substrate epitaxial silicon thickness measurements of epitaxial silicon deposited on substrates using a method (e.g., method 100 described herein). As illustrated, the substrate-to-substrate variation for a given thickness profile is reduced using a method as described herein, compared to a typical method. The variation using method 100 as illustrated in FIG. 6 is less than the resolution of the line connecting the data.

Figure 7:
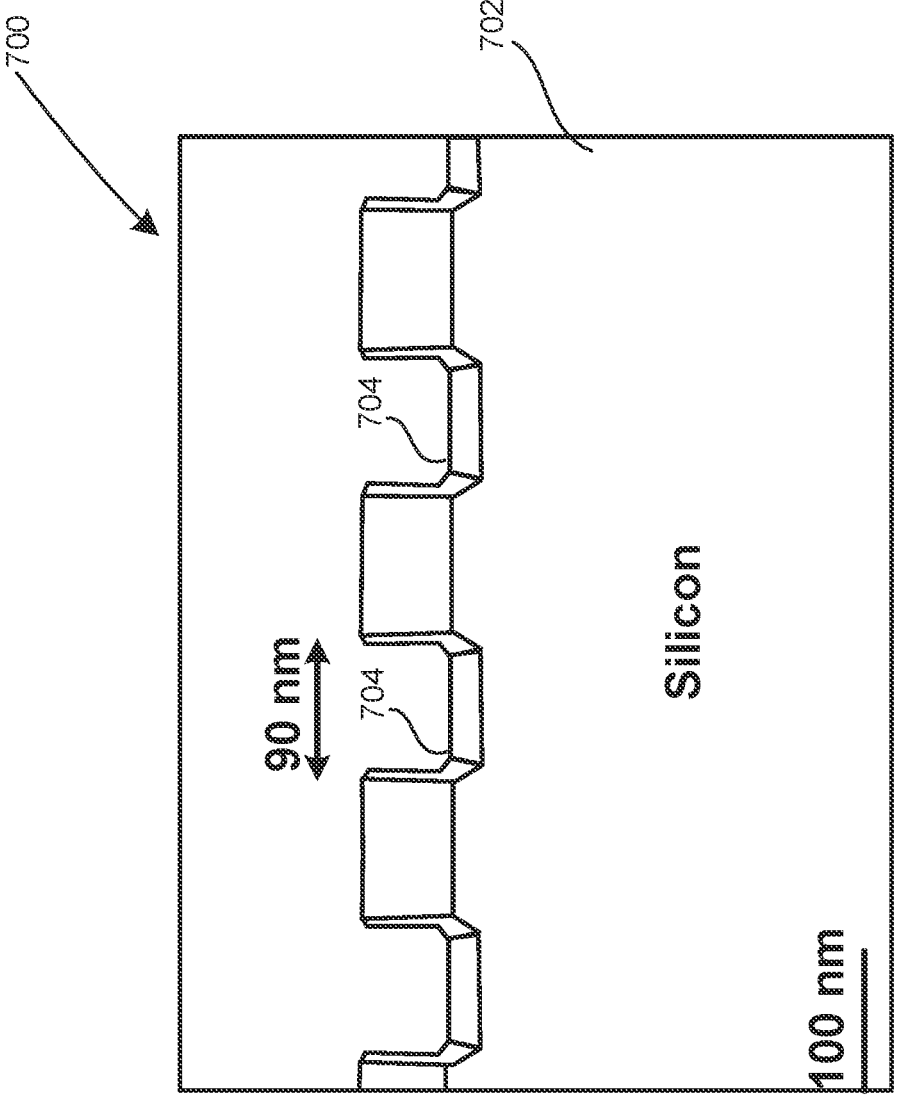
FIG. 7 illustrates a patterned substrate suitable for use with a method in accordance with examples of the disclosure.
Figure 8:
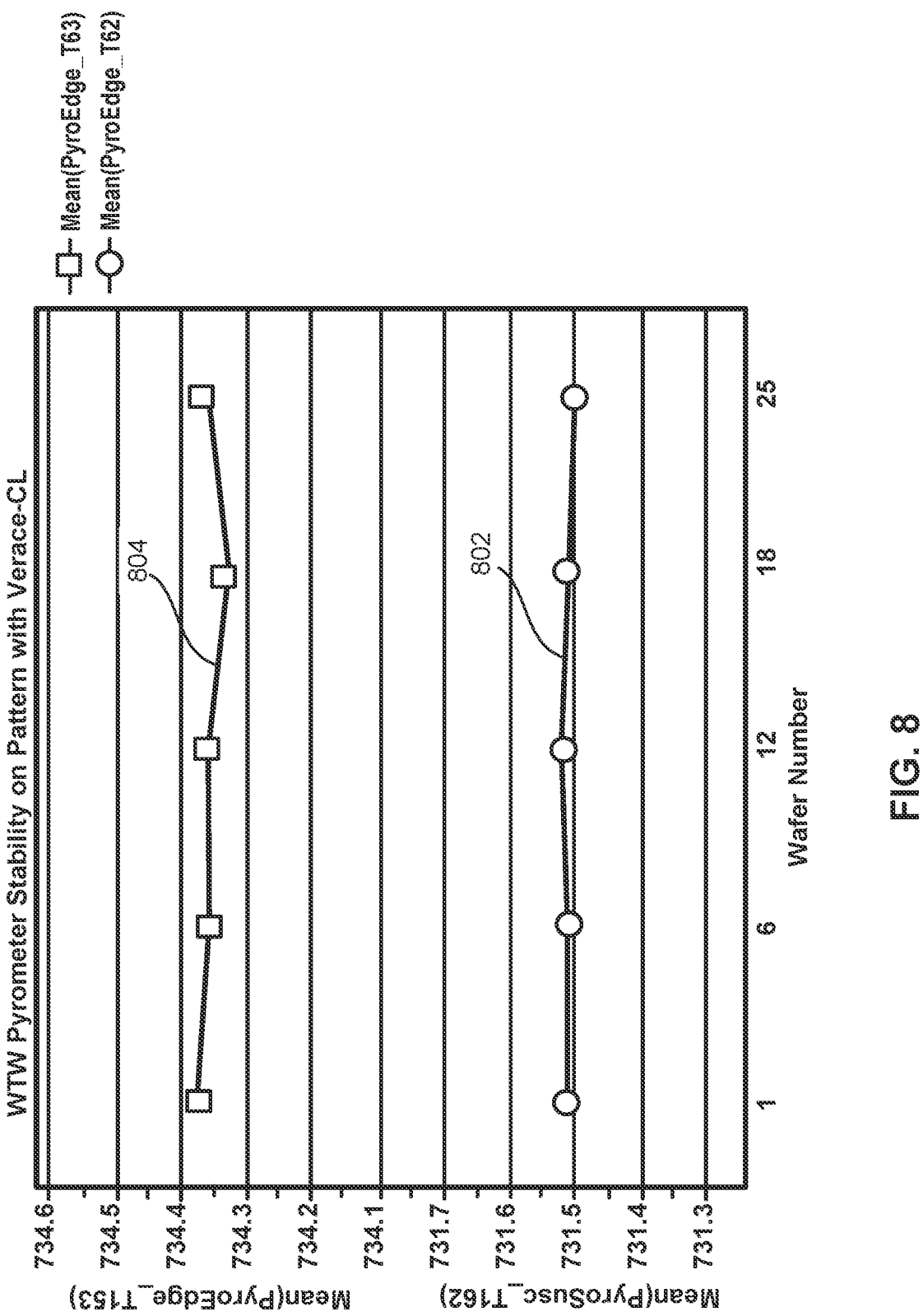
FIG. 8 illustrates first and second substrate location temperature variation obtained using a method in accordance with exemplary embodiments of the disclosure.

FIG. 7 illustrates a test structure 700 to measure epitaxial silicon 704 uniformity on a patterned substrate 702. FIG. 8 illustrates the relatively low temperature variation temperatures at a first substrate location (e.g., a center) represented by line 802 and at a second substrate location represented by line 804 on structure 700.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. Thus, the various acts illustrated may be performed in the sequence illustrated, in other sequences, or omitted in some cases.

The subject matter of the present disclosure includes all novel and nonobvious combinations and sub combinations of the various processes, systems, and configurations, and other features, functions, acts, and/or properties disclosed herein, as well as any and all equivalents thereof.

The invention claimed is:

1. A method of forming silicon within a gap on a surface of a substrate, the method comprising:
providing the substrate within a reaction chamber of a reactor, the reactor comprising a first zone of one or more heaters and a second zone of one or more heaters; and
selectively forming epitaxial silicon on a bottom surface of the gap relative to a sidewall of the gap, wherein during the step of selectively forming epitaxial silicon, the method further comprises:
measuring one or more first substrate temperatures at a first substrate location using a first pyrometer;
measuring one or more second substrate temperatures at a second substrate location using a second pyrometer;
responsive to the step of measuring one or more first substrate temperatures, independently controlling the first zone of one or more heaters; and
responsive to the step of measuring one or more second substrate temperatures, independently controlling the second zone of one or more heaters.

2. The method according to claim 1, wherein the first substrate location is at a center location of the substrate.

3. The method according to claim 1, wherein the second substrate location is radially exterior the first substrate location.

4. The method according to claim 1, wherein the step of independently controlling the first zone of one or more heaters comprises comparing a first substrate temperature of the one or more first substrate temperatures to a first substrate temperature setpoint.

5. The method according to claim 1, wherein the step of independently controlling the second zone of one or more heaters comprises comparing the second substrate temperature of the one or more second substrate temperatures to a second substrate temperature setpoint.

6. The method according to claim 1, wherein the step of measuring one or more first substrate temperatures comprises measuring a plurality of first location temperatures at the first substrate location to obtain a plurality of first location temperature measurements, and wherein the step of independently controlling the first zone of one or more heaters comprises comparing a value derived from the plurality of first location temperature measurements to a first substrate temperature setpoint.

7. The method according to claim 1, wherein the step of measuring one or more second substrate temperatures comprises measuring a plurality of second location temperatures at the second substrate location to obtain a plurality of second location temperature measurements, and wherein the step of independently controlling the second zone of one or more heaters comprises comparing a value derived from the plurality of second location temperature measurements to a second substrate temperature setpoint.

8. The method according to claim 1, further comprising determining a temperature difference between at least one of the one or more first substrate temperatures and at least one of the one or more second substrate temperatures, wherein one or more of the steps of independently controlling the first zone of one or more heaters and independently controlling the second zone of one or more heaters is responsive to the temperature difference.

9. The method according to claim 8, comprising comparing the temperature difference to a temperature difference setpoint.

10. The method according to claim 8, wherein one or more of the steps of independently controlling the first zone of one or more heaters and independently controlling the second zone of one or more heaters is responsive to the temperature difference and one or more of the value derived from the plurality of first location temperature measurements and the value derived from the plurality of second location temperature measurements.

11. The method according to claim 4, wherein the first substrate temperature setpoint is different than a second substrate temperature setpoint.

12. The method according to claim 1, wherein the first zone of one or more heaters comprises 2 to 12 or 2 to 8 or 2 to 4 heaters above the reaction chamber, and wherein the second zone of one or more heaters comprises 2 to 12 or 2 to 8 or 2 to 4 heaters above the reaction chamber.

13. The method according to claim 1, wherein the first zone of one or more heaters comprises at least one heater above a substrate support and at least one heater beneath the substrate support, and wherein the second zone of one or more heaters comprises at least one heater above the substrate support and at least one heater beneath the substrate support.

14. The method according to claim 1, wherein the first zone of one or more heaters comprises two or more first zone heaters, the method further comprising determining a first power offset for two or more of the first zone heaters, wherein the step of independently controlling the first zone of one or more heaters comprises providing power to the two or more first zone heaters responsive to the first power offset.

15. The method according to claim 1, wherein the second zone of one or more heaters comprises two or more second zone heaters, the method further comprising determining a second power offset for two or more of the second zone heaters, wherein the step of independently controlling the second zone of one or more heaters comprises providing power to the two or more second zone heaters responsive to the second power offset.

16. The method according to claim 1, further comprising a step of determining a desired temperature profile within a first region on the substrate, wherein a first power offset is based on the desired temperature profile within the first region on the substrate.

17. The method according to claim 1, further comprising a step of determining a desired temperature profile within a second region on the substrate, wherein a second power offset is based on the desired temperature profile within the second region on the substrate.

18. The method according to claim 1, wherein the step of selectively forming epitaxial silicon on a bottom surface comprises:

depositing silicon within the gap; and etching silicon to remove silicon from the sidewall.

19. The method according to claim 18, wherein one or more of a first substrate temperature setpoint and a second substrate temperature setpoint differs for the step of depositing and the step of etching.

20. The method according to claim 18, further comprising repeating the steps of depositing and etching to fill the gap with silicon.

*     *     *     *     *